(12) United States Patent
Arnold et al.

(10) Patent No.: US 9,373,580 B2
(45) Date of Patent: Jun. 21, 2016

(54) DUAL HARD MASK LITHOGRAPHY PROCESS

(71) Applicant: GLOBALFOUNDRIES INC., Grand Cayman (KY)

(72) Inventors: John C. Arnold, North Chatham, NY (US); Sean D. Burns, Hopewell Junction, NY (US); Steven J. Holmes, Ossining, NY (US); David V. Horak, Essex Junction, VT (US); Muthumanickam Sankarapandian, Niskayuna, NY (US); Yunpeng Yin, Niskayuna, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 92 days.

(21) Appl. No.: 14/140,060

(22) Filed: Dec. 24, 2013

(65) Prior Publication Data

US 2014/0110846 A1   Apr. 24, 2014

Related U.S. Application Data

(62) Division of application No. 13/402,068, filed on Feb. 22, 2012, now Pat. No. 8,916,337.

(51) Int. Cl.
*H01L 21/00* (2006.01)
*H01L 23/522* (2006.01)
(Continued)

(52) U.S. Cl.
CPC .......... *H01L 23/5226* (2013.01); *G03F 7/0035* (2013.01); *G03F 7/091* (2013.01); *G03F 7/094* (2013.01); *H01L 21/0332* (2013.01);
(Continued)

(58) Field of Classification Search
CPC .............. H01L 23/5226; H01L 21/31144; H01L 21/0332; H01L 21/3081; H01L 21/3088
USPC ............ 257/E21.035, E21.232; 438/947, 945
See application file for complete search history.

(56) References Cited

U.S. PATENT DOCUMENTS 5,741,625 A   4/1998  Bae et al.
6,015,650 A   1/2000  Bae
(Continued)

OTHER PUBLICATIONS

International Search Report and Written Opinion dated Apr. 26, 2013, issued in corresponding International Application No. PCT/US2012/070784.

(Continued)

*Primary Examiner* — Kimberly Rizkallah
*Assistant Examiner* — Maria Ligai
(74) *Attorney, Agent, or Firm* — Scully, Scott, Murphy & Presser, P.C.

(57) ABSTRACT

A first metallic hard mask layer over an interconnect-level dielectric layer is patterned with a line pattern. At least one dielectric material layer, a second metallic hard mask layer, a first organic planarization layer (OPL), and a first photoresist are applied above the first metallic hard mask layer. A first via pattern is transferred from the first photoresist layer into the second metallic hard mask layer. A second OPL and a second photoresist are applied and patterned with a second via pattern, which is transferred into the second metallic hard mask layer. A first composite pattern of the first and second via patterns is transferred into the at least one dielectric material layer. A second composite pattern that limits the first composite pattern with the areas of the openings in the first metallic hard mask layer is transferred into the interconnect-level dielectric layer.

16 Claims, 16 Drawing Sheets

(51) Int. Cl.
*G03F 7/00* (2006.01)
*G03F 7/09* (2006.01)
*H01L 21/768* (2006.01)
*H01L 21/033* (2006.01)
*H01L 21/311* (2006.01)
*H01L 21/308* (2006.01)

(52) U.S. Cl.
CPC ...... *H01L21/0338* (2013.01); *H01L 21/31144* (2013.01); *H01L 21/76811* (2013.01); *H01L 21/76816* (2013.01); *H01L 21/3081* (2013.01); *H01L 21/3088* (2013.01); *H01L 2924/0002* (2013.01); *Y10T 428/24355* (2015.01)

(56) References Cited

U.S. PATENT DOCUMENTS

| | | |
|---|---|---|
| 7,585,614 B2 | 9/2009 | Furukawa et al. |
| 7,642,184 B2 | 1/2010 | Chang et al. |
| 7,862,982 B2 | 1/2011 | Burns et al. |
| 8,008,206 B2 | 8/2011 | Liang et al. |
| 2002/0006730 A1 | 1/2002 | Ishibashi |
| 2004/0101988 A1* | 5/2004 | Roman et al. ............ 438/40 |
| 2005/0202350 A1 | 9/2005 | Colburn et al. |
| 2007/0066047 A1 | 3/2007 | Ye et al. |
| 2008/0020570 A1 | 1/2008 | Naik |
| 2009/0181330 A1* | 7/2009 | Gabor et al. ............ 430/322 |
| 2010/0144155 A1* | 6/2010 | Yatsuda et al. ............ 438/700 |
| 2010/0279234 A1 | 11/2010 | Yu et al. |
| 2011/0049680 A1 | 3/2011 | Burns et al. |
| 2012/0129337 A1* | 5/2012 | Chen et al. ............ 438/636 |

OTHER PUBLICATIONS

U.S. Office Action dated Mar. 27, 2014 received in parent U.S. Application, namely U.S. Appl. No. 13/402,068.

* cited by examiner

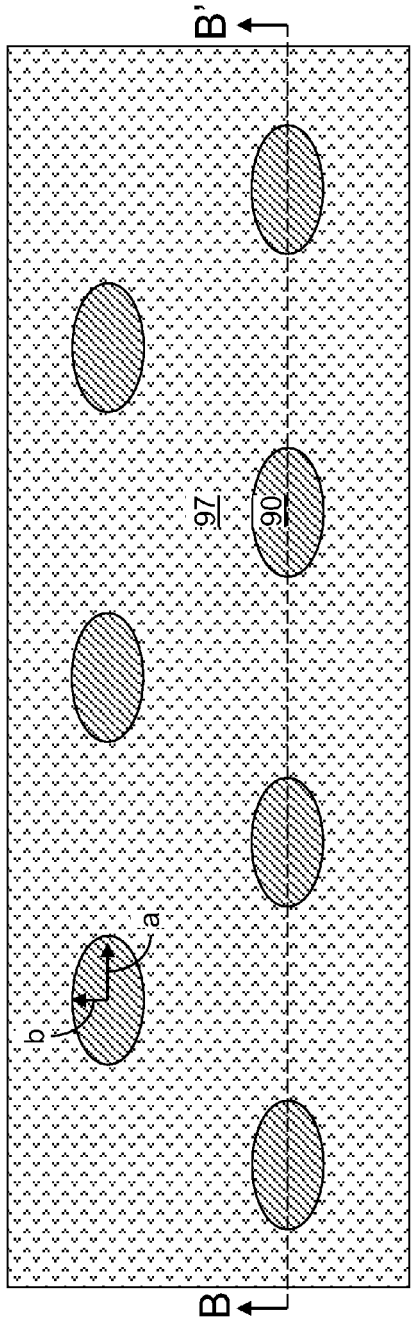
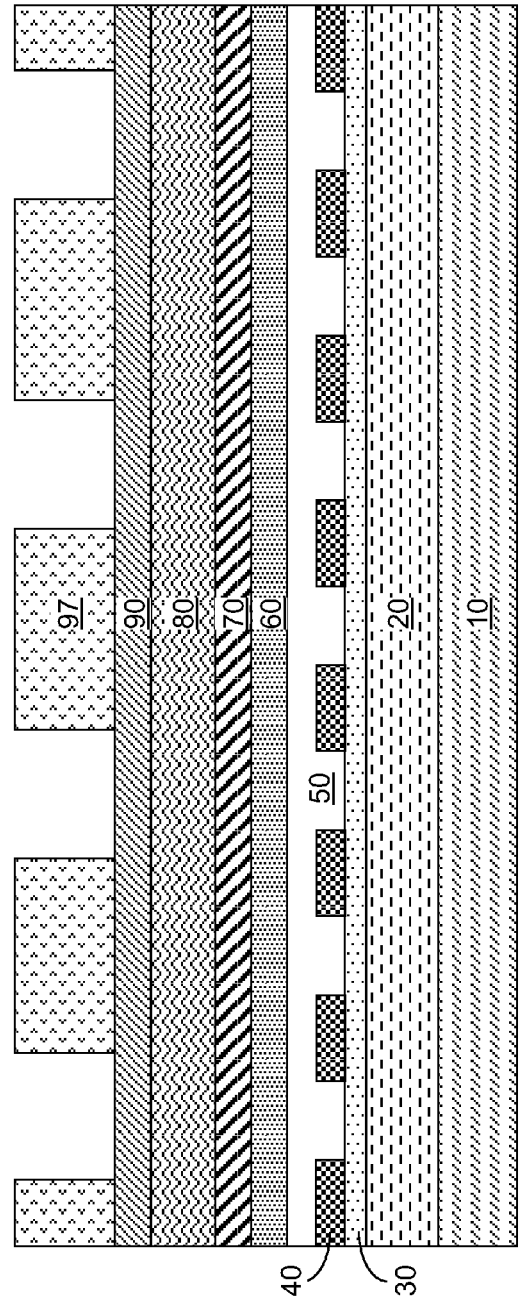

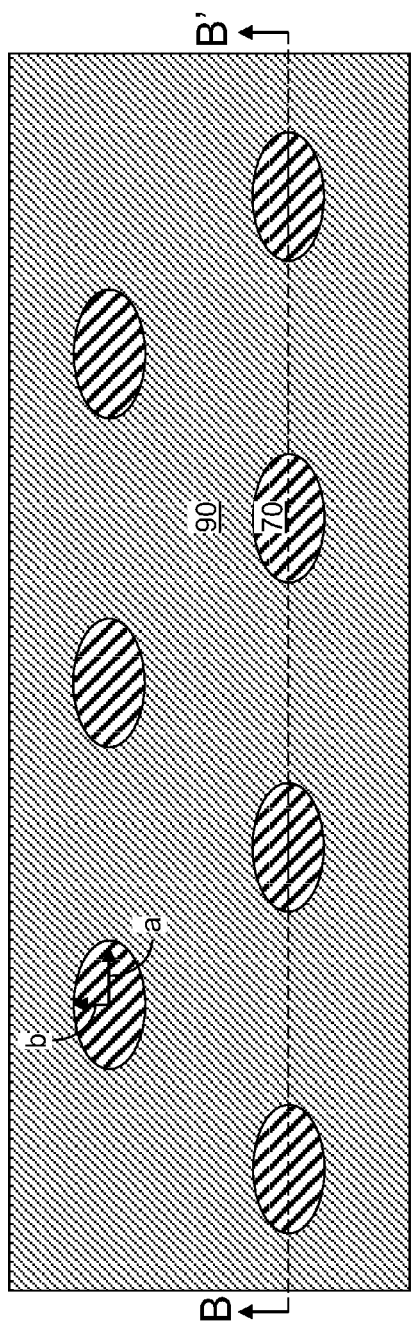
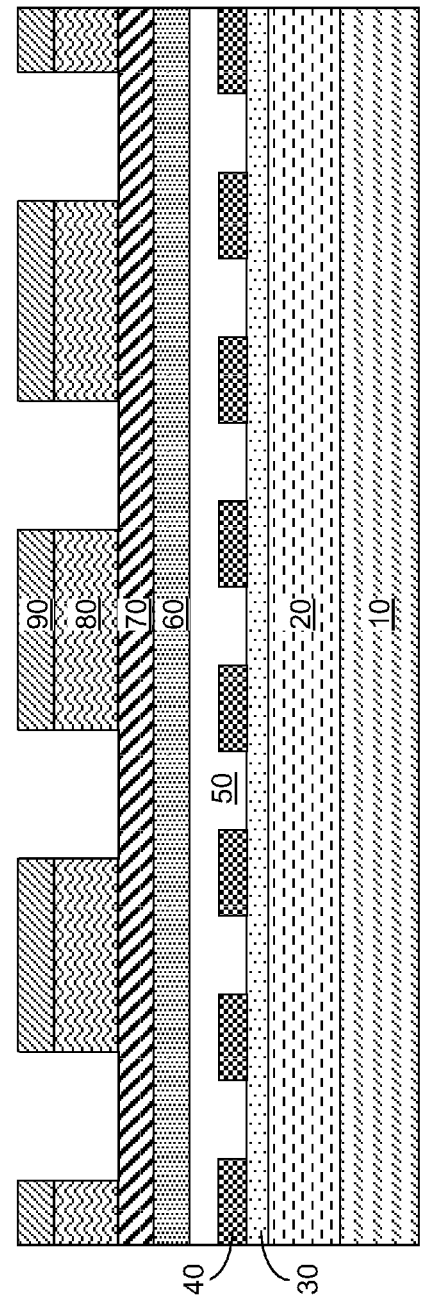
FIG. 3A
FIG. 3B

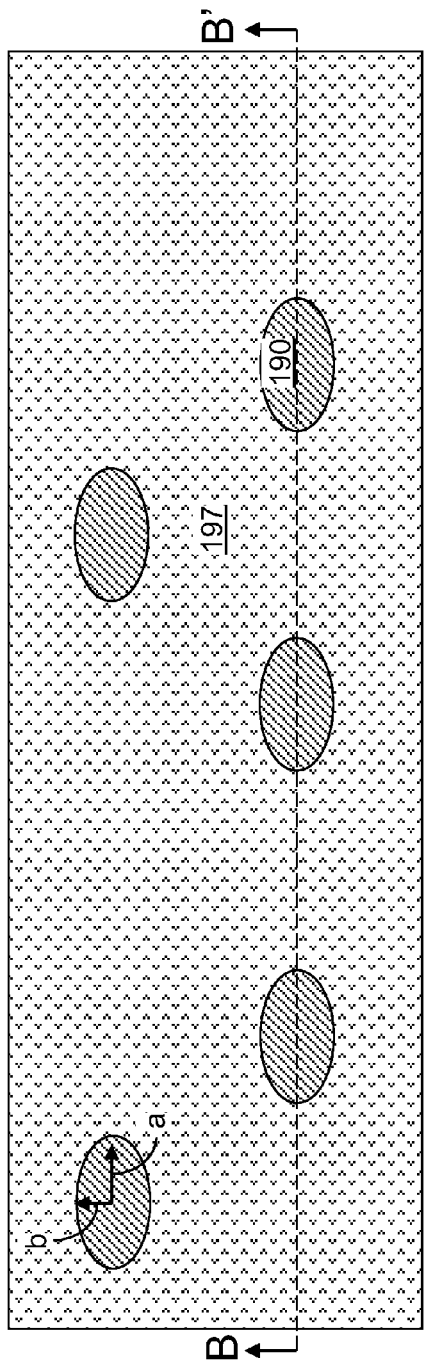
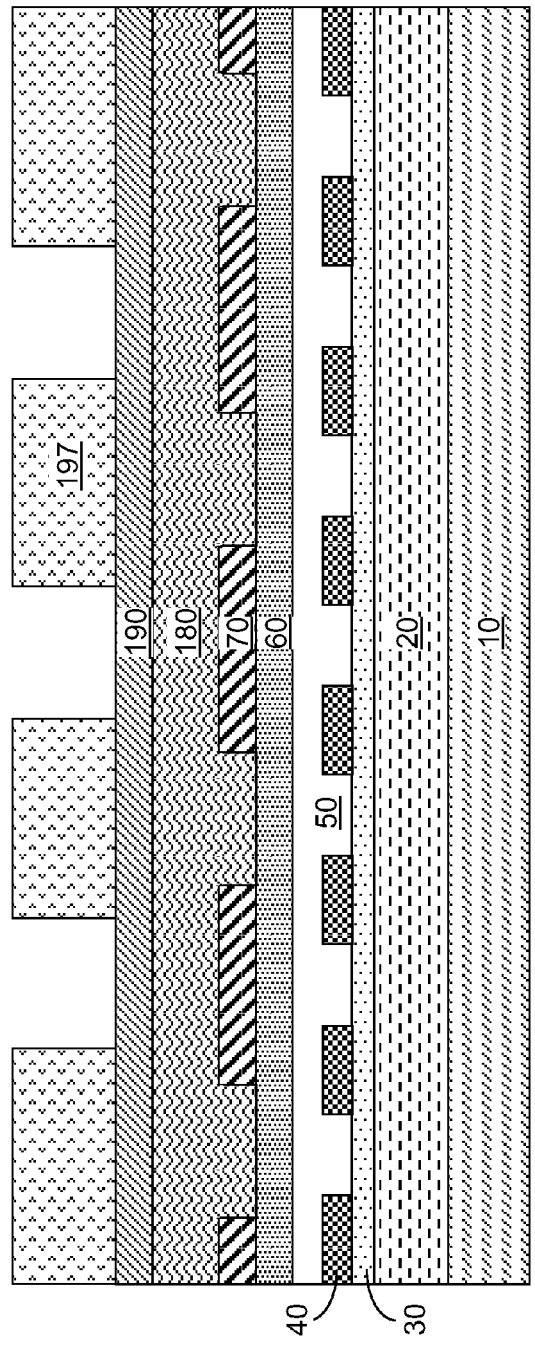
FIG. 6A
FIG. 6B

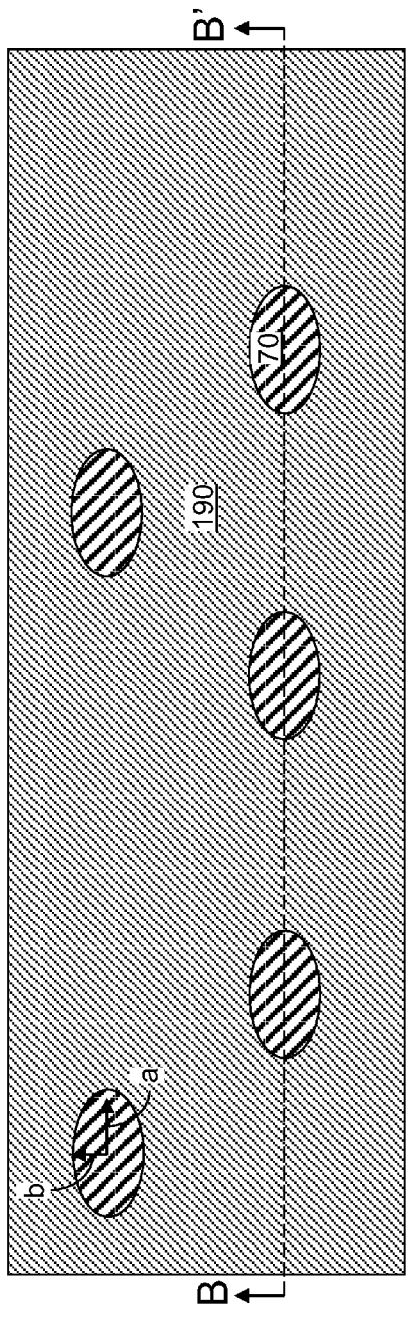
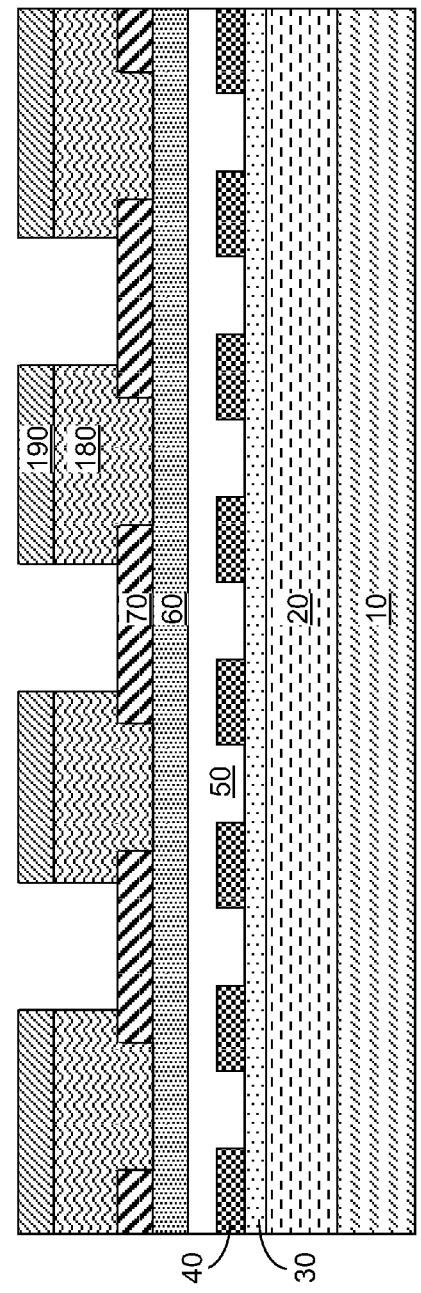

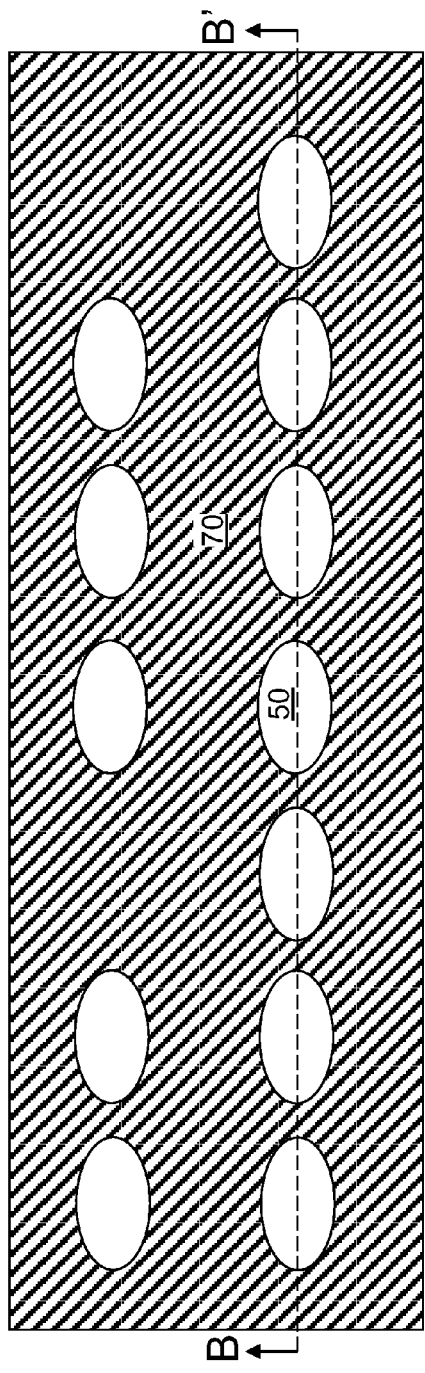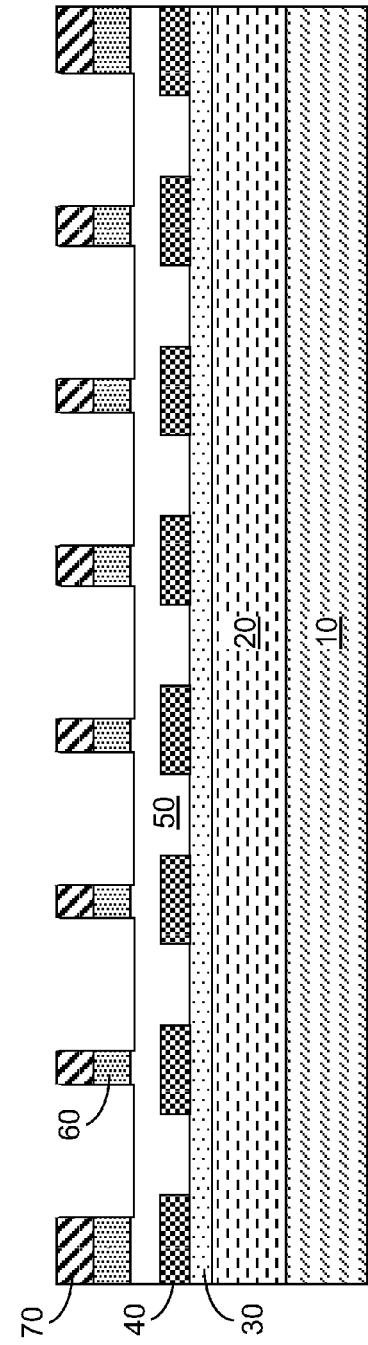
FIG. 10A
FIG. 10B

DUAL HARD MASK LITHOGRAPHY PROCESS

CROSS REFERENCE TO RELATED APPLICATION

This application is a divisional of U.S. patent application Ser. No. 13/402,068, filed Feb. 22, 2012 the entire content and disclosure of which is incorporated herein by reference.

BACKGROUND

The present disclosure relates to methods of forming lithographic patterns, and particularly to methods of forming lithographic patterns employing bilayer metallic hard masks, and structures for effecting the same.

Single exposure lithography employing a 193 nm wavelength light source is approaching its limit at printing features having a pitch less than 80 nm. In order to print features having a pitch less than 80 nm, therefore, double exposure methods have been proposed.

Double via exposure methods as known in the art employ an organic planarization layer (OPL) to memorize two lithographic patterns, which are transferred into the organic planarization layer through two distinct combinations of lithographic exposure and development and a pattern transfer etch. During the second pattern trilayer lithography, the first pattern memorized in the lower OPL are filled with the upper OPL layer, and hence the first pattern needs to be re-opened during the second pattern transfer into the lower OPL. Since the OPL thickness to be removed in the first patterns includes both the lower OPL and the upper OPL, during the second pattern transfer into the lower OPL, the OPL etch time in the first patterns needs to be 100% longer than in the second pattern. For this reason, the fidelity of pattern transfer is compromised for the pattern that is transferred first. Specifically, the via holes derived from the second pattern tend to become wider and develop irregularities during the transfer of the first pattern into the organic planarization layer. Therefore, a method is desired to transfer two patterns with high fidelity to form a composite pattern including sublithographic features.

BRIEF SUMMARY

A first metallic hard mask layer is deposited over an interconnect-level dielectric layer and is patterned with a line pattern. At least one dielectric material layer, a second metallic hard mask layer, a first organic planarization layer, and a first photoresist are applied above the first metallic hard mask layer. The first photoresist is patterned with a first via pattern, which is transferred into the second metallic hard mask layer, with top dielectric layer in the at least one dielectric layer as the etch stop layer. After removing the first organic planarization layer, a second organic planarization layer and a second photoresist are applied. The second photoresist is patterned with a second via pattern, which is transferred into the second metallic hard mask layer. The second metallic hard mask layer includes a first composite pattern of the first and second via patterns, which is transferred into at least one dielectric material layer, using the second metallic layer as the etch masking layer. A second composite pattern that limits the first composite pattern with the areas of the openings in the first metallic hard mask layer is transferred into the interconnect-level dielectric layer to form a composite via pattern therein. The line pattern can be subsequently transferred into the upper portion of the interconnect-level dielectric layer.

According to an aspect of the present disclosure, a method of forming a structure includes: forming a stack including at least a dielectric material layer and a first metallic hard mask layer; patterning the first metallic hard mask layer with at least one line pattern; forming at least a second metallic hard mask layer over the patterned first metallic hard mask layer; forming a first composite pattern including a first lithographic pattern and a second lithographic pattern in the second metallic hard mask layer only, wherein the first lithographic pattern and the second lithographic pattern are transferred into the second metallic hard mask layer by different etch processes; and transferring a second composite pattern including an intersection of the first composite pattern and the at least one line pattern into the dielectric material layer.

According to another aspect of the present disclosure, a method of forming a structure includes: forming a stack including at least a dielectric material layer and a first metallic hard mask layer; patterning the first metallic hard mask layer with at least one line pattern; forming at least a second metallic hard mask layer and a first photoresist layer over the patterned first metallic hard mask layer; forming a first lithographic pattern in the first photoresist layer and transferring the first lithographic pattern into the second metallic hard mask layer by a first etch; forming a second photoresist layer over the second metallic hard mask layer; patterning a second lithographic pattern in the second photoresist layer and transferring the second lithographic pattern into the second metallic hard mask layer by a second etch, wherein a first composite pattern including the first lithographic pattern and the second lithographic pattern is formed in the second metallic hard mask layer; and transferring a second composite pattern including an intersection of the first composite pattern and the at least one line pattern into the dielectric material layer.

According to yet another aspect of the present disclosure, a method of forming a structure includes: forming a stack including at least a dielectric material layer and a first metallic hard mask layer; patterning the first metallic hard mask layer with at least one line pattern; forming at least another dielectric material layer, a second metallic hard mask layer, and a first photoresist layer over the patterned first metallic hard mask layer; forming a first lithographic pattern in the first photoresist layer and transferring the first lithographic pattern into the second metallic hard mask layer by a first etch; forming a second photoresist layer over the second metallic hard mask layer; patterning a second lithographic pattern in the second photoresist layer and transferring the second lithographic pattern into the second metallic hard mask layer by a second etch, wherein a first composite pattern including the first lithographic pattern and the second lithographic pattern is formed in the second metallic hard mask layer; transferring the first composite pattern through the at least another dielectric material layer; and transferring a second composite pattern including an intersection of the first composite pattern and the at least one line pattern into the dielectric material layer.

According to even another aspect of the present disclosure, a lithographic structure is provided, which includes: a dielectric material layer located on a substrate; a first metallic hard mask layer including at least one line pattern and located over the dielectric material layer; at least another dielectric material layer located on the first metallic hard mask layer; a second metallic hard mask layer located on the at least another dielectric material layer and including at least a set of at least one hole corresponding to a first lithographic pattern; and an organic planarization layer located on the second metallic hard mask layer and including at least one trench corresponding to a second lithographic pattern different from the first lithographic pattern.

According to still another aspect of the present disclosure, a lithographic structure includes: a dielectric material layer located on a substrate; a first metallic hard mask layer including at least one line pattern and located over the dielectric material layer; at least another dielectric material layer located on the first metallic hard mask layer; a second metallic hard mask layer located on the at least another dielectric material layer and including at least a set of at least one hole corresponding to a first lithographic pattern; an organic planarization layer located on the second metallic hard mask layer; and an anti-reflective coating (ARC) located on the organic planarization layer and including at least one trench corresponding to a second lithographic pattern different from the first lithographic pattern.

BRIEF DESCRIPTION OF THE SEVERAL VIEWS OF THE DRAWINGS

FIG. 2A is a top-down view of the first exemplary structure after formation of a stack of a lower planarization layer and an upper dielectric layer, a second metallic hard mask layer, a first organic planarization layer (OPL), a first anti-reflective coating (ARC) layer, and a first photoresist layer, and lithographic patterning of the first photoresist layer with a first lithographic pattern according to the first embodiment of the present disclosure.

FIG. 2B is a vertical cross-sectional view along the plane B-B' of the first exemplary structure of FIG. 2A.

FIG. 3A is a top-down view of the first exemplary structure after transfer of the first lithographic pattern through the first ARC layer and the first OPL according to the first embodiment of the present disclosure.

FIG. 3B is a vertical cross-sectional view along the plane B-B' of the first exemplary structure of FIG. 3A.

FIG. 6A is a top-down view of the first exemplary structure after formation of a second OPL, a second ARC layer, and a second photoresist layer, and lithographic patterning of the second photoresist layer with a second lithographic pattern according to the first embodiment of the present disclosure.

FIG. 6B is a vertical cross-sectional view along the plane B-B' of the first exemplary structure of FIG. 6A.

FIG. 7A is a top-down view of the first exemplary structure after transfer of the second lithographic pattern through the second ARC layer and the second OPL according to the first embodiment of the present disclosure.

FIG. 7B is a vertical cross-sectional view along the plane B-B' of the first exemplary structure of FIG. 7A.

FIG. 10A is a top-down view of the first exemplary structure after transfer of a first composite pattern in the second metallic hard mask layer through the upper dielectric layer according to the first embodiment of the present disclosure.

FIG. 10B is a vertical cross-sectional view along the plane B-B' of the first exemplary structure of FIG. 10A.

DETAILED DESCRIPTION

Figure 1A:
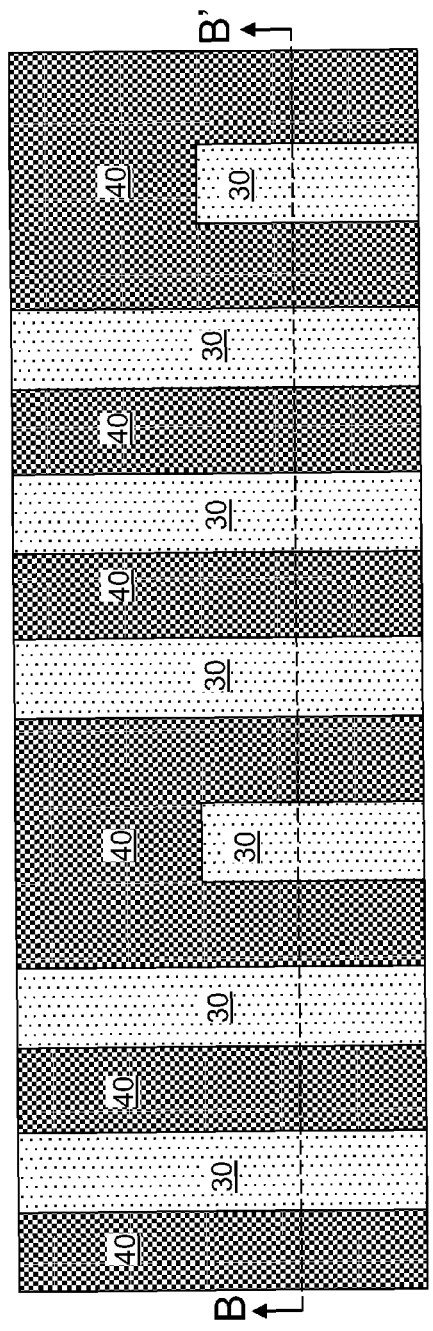
FIG. 1A is a top-down view of a first exemplary structure after formation and patterning of a first metallic hard mask layer according to a first embodiment of the present disclosure.

As stated above, the present disclosure relates to methods of forming lithographic patterns employing bilayer hard masks, and structures for effecting the same, which are now described in detail with accompanying figures. It is noted that like and corresponding elements are referred to by like reference numerals. The drawings are not in scale.

Figure 1B:
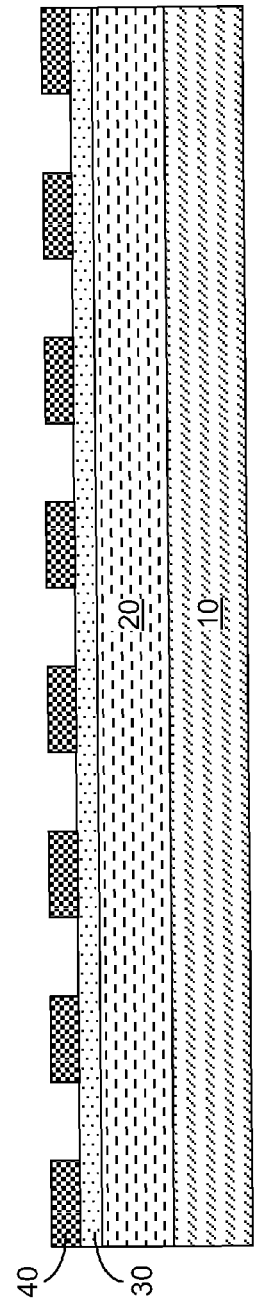
FIG. 1B is a vertical cross-sectional view along the plane B-B' of the first exemplary structure of FIG. 1A.

Referring to FIGS. 1A and 1B, a first exemplary structure according to a first embodiment of the present disclosure includes a stack, from bottom to top, of a substrate 10, an interconnect-level dielectric material layer 20, a dielectric hard mask layer 30, and a first metallic hard mask layer 40. The substrate 10 can be a semiconductor substrate including at least one semiconductor device (not shown) such as a field effect transistor, a junction transistor, a diode, a capacitor, an inductor, a resistor, an optoelectronic device, or any other semiconductor devices known in the art. The substrate 10 may optionally include at least one metal interconnect structures that include metal lines and/or metal vias embedded in at least one underlying interconnect-level dielectric material layer (not shown explicitly).

The interconnect-level dielectric material layer 20 can be an unpatterned dielectric material layer, and can include any dielectric material that can embed metal interconnect structures. For example, the interconnect-level dielectric material layer can include silicon oxide, silicon nitride, silicon oxynitride, porous or non-porous organosilicate glass, a porous or non-porous spin-on dielectric material. The thickness of the interconnect-level dielectric material layer 20 can be from 50 nm to 1,000 nm, although lesser and greater thicknesses can also be employed. The interconnect-level dielectric material layer 20 can be formed by chemical vapor deposition (CVD) or spin-coating.

The dielectric hard mask 30 layer is an optional layer. The dielectric hard mask layer 30 can be omitted if the interconnect-level dielectric material layer 20 has sufficient mechanical strength to withstand a planarization process. For example, if a top portion of the interconnect-level dielectric mask layer 20 includes silicon oxide, silicon nitride, or silicon oxynitride, the dielectric hard mask layer 30 can be omitted. The dielectric hard mask layer 30 can include a material selected from silicon oxide, silicon nitride, silicon oxynitride, a dielectric metal oxide, or a combination thereof. The dielectric hard mask layer 30 can be formed, for example, by chemical vapor deposition, atomic layer deposition, and/or physical vapor deposition. The thickness of the dielectric hard mask layer 30 can be from 5 nm to 50 nm, although lesser and greater thicknesses can also be employed.

The first metallic hard mask layer 40 includes at least one metallic material and optionally includes an organic metallic material. The first metallic hard mask layer 40 includes a material that provides an etch selectivity to the materials of the dielectric hard mask layer 30 and the interconnect-level dielectric material layer 20.

In one embodiment, the first metallic hard mask layer 40 consists of at least one metallic material. For example, the first metallic hard mask layer 40 can include one or more of TiN, TaN, WN, Ti, Ta, and W.

In another embodiment, the first metallic hard mask layer 40 includes at least one metallic material and an organic material such as a polymer. The at least one metallic material can include one or more of Ta, Ti, W, TaN, TiN, and WN. The at least one metallic material can be interspersed within a matrix of the organic material. For example, the first metallic hard mask layer 40 can include a metal-organic antireflective coating (ARC) material such as Ti-including ARC material.

The first metallic hard mask layer 40 can be formed by chemical vapor deposition (CVD), physical vapor deposition (PVD), or spin-coating. The thickness of the first metallic hard mask layer 40 can be from 5 nm to 50 nm, although lesser and greater thicknesses can also be employed.

The first metallic hard mask layer 40 is subsequently patterned with at least one line pattern. As used herein, a line pattern refers to a pattern that includes at least one pair of parallel line edges separated by an opening therebetween. The at least one line pattern can be formed by a single lithographic process including application of a photoresist, lithographic exposure and development of the photoresist with a lithographic pattern, and transfer of the lithographic pattern from the photoresist into the first metallic hard mask layer 40, and removal of the photoresist.

Alternatively, the at least one line pattern can be formed by a plurality of lithographic processes. Each of the plurality of lithographic processes includes application of a photoresist, lithographic exposure and development of the photoresist with a lithographic pattern, and transfer of the lithographic pattern from the photoresist into the first metallic hard mask layer 40, and removal of the photoresist. Each lithographic pattern among the plurality of lithographic processes can be different. In one embodiment, the at least one line pattern in the first metallic hard mask layer 40 can have a sublithographic spacing if a plurality of lithographic processes are employed to form the at least one line pattern. As used herein, a sublithographic feature refers to a feature having a dimension smaller than the dimension of a minimum feature that can be printed through a single exposure lithographic process. As of 2012, the minimum pitch that can be printed by a single exposure lithographic process is about 80 nm.

Referring to FIGS. 2A and 2B, at least one dielectric material layer (50, 60), a second metallic hard mask layer 70, a first organic planarization layer (OPL) 80, a first anti-reflective coating (ARC) layer, and a first photoresist layer 97 are sequentially deposited.

The at least one dielectric material layer (50, 60) can be a stack of a plurality of dielectric material layers, or a single dielectric material layer, or a combination of an organic planarization layer and a dielectric material layer. For example, the at least one dielectric material layer (50, 60) can be a stack of a lower planarization layer 50 and an upper dielectric layer 60.

In one embodiment, the lower planarization layer 50 includes at least one of a self-planarizing organic planarization material or amorphous carbon. The self-planarizing organic planarization material can be a polymer layer with low viscosity so that the material of the lower planarization layer 50 flows to fill recessed regions, i.e., the trenches formed within the first metallic hard mask layer 40, upon application or deposition. The self-planarizing organic planarization material can be any material employed for an organic planarization layer in trilayer lithography methods known in the art. The lower planarization layer 50 can be formed, for example, by spin coating or chemical vapor deposition. The thickness of the lower planarization layer 50 can be from 50 nm to 200 nm, although lesser and greater thicknesses can also be employed. The upper dielectric layer 60 can be silicon oxide layer or a silicon-containing anti-reflective coating (ARC) layer. The silicon oxide layer can be deposited, for example, by spin coating or by chemical vapor deposition. The silicon-containing ARC layer can be deposited by spin coating. The thickness of the upper dielectric layer 60 can be from 10 nm to 100 nm, although lesser and greater thicknesses can also be employed.

The second metallic hard mask layer 70 includes at least one metallic material and optionally includes an organic material. The second metallic hard mask layer 70 includes a material that provides an etch selectivity to the materials of the at least one dielectric material layer (50, 60).

In one embodiment, the second metallic hard mask layer 70 consists of at least one metallic material. For example, the second metallic hard mask layer 70 can include one or more of TiN, TaN, WN, Ti, Ta, and W.

In another embodiment, the second metallic hard mask layer 70 includes at least one metallic material and an organic material such as a polymer. The at least one metallic material can include one or more of Ta, Ti, W, TaN, TiN, and WN. The at least one metallic material can be interspersed within a matrix of the organic material. For example, the second metallic hard mask layer 70 can include a metal-organic antireflective coating (ARC) material such as Ti-including ARC material.

The second metallic hard mask layer 70 can be formed by chemical vapor deposition (CVD), physical vapor deposition (PVD), or spin-coating. The thickness of the second metallic hard mask layer 70 can be from 5 nm to 50 nm, although lesser and greater thicknesses can also be employed.

The first organic planarization layer (OPL) 80 is formed over the second metallic hard mask layer 70, for example, by spin coating. The first OPL 80 includes a self-planarizing organic planarization material, which can be a polymer layer with low viscosity. The self-planarizing organic planarization material can be any material employed for an organic planarization layer in trilayer lithography methods known in the art. The thickness of the first OPL 80 can be from 100 nm to 200 nm, although lesser and greater thicknesses can also be employed.

The first anti-reflective coating (ARC) layer 90 is an optional layer, and can be formed, for example, by spin coating. The first ARC layer 90 can include any anti-reflective material known in the art, and can include silicon and/or an organic material. The thickness of the first ARC layer 90 can be from 10 nm to 100 nm, although lesser and greater thicknesses can also be employed.

The first photoresist layer 97 is applied directly on the first ARC layer 90 or directly on the first OPL 80, for example, by spin coating. The thickness of the first photoresist layer 97 can be from 50 nm to 600 nm, although lesser and greater thicknesses can also be employed. The first photoresist layer 97 can be a layer of a photoresist sensitive to deep-ultraviolet (DUV) radiation, extreme ultraviolet (EUV), or mid-ultraviolet (MUV) radiation as known in the art, or can be an e-beam resist that is sensitive to radiation of energetic electrons.

The first photoresist layer 97 is patterned with a first lithographic pattern by lithographic exposure and development. The first lithographic pattern can be a via pattern including shapes for a plurality of first via holes. The shapes for the plurality of first via holes can include circles and/or ellipses. In one embodiment, the plurality of first via holes can include via holes that have minimum printable sizes for any given shape, e.g., a minimum-printable size circle or a minimum printable size ellipse for any given eccentricity. In one embodiment, the plurality of first via holes can include one or more of an ellipse having a semiminor axis b in a direction parallel to the lengthwise direction of the lines in the at least one line pattern in the first metallic hard mask layer 40 and having a semimajor axis in the direction perpendicular to the lengthwise direction of the lines in the at least one line pattern in the first metallic hard mask layer 40. Selection of the semiminor axis b in the direction parallel to the lengthwise direction of the lines in the at least one line pattern in the first metallic hard mask layer 40 enables subsequent formation of a via hole having a width in the perpendicular to the metal line direction that is less than the minimum printable diameter for a circle in a lithographic pattern. In one embodiment, the vias can be only transferred into the dielectric layer 20 within the metal trenches. This structure is herein referred to as "self-aligned vias," i.e., vias self-aligned to the metal trenches.

Referring to FIGS. 3A and 3B, the first lithographic pattern in the first photoresist layer 97 is transferred into underlying layers through a set of at least one etch process, which is herein collectively referred to a "first etch." Specifically, the first lithographic pattern in the first photoresist layer 97 is transferred into the first ARC layer 90 employing the first photoresist layer 97 as an etch mask during a first step of the first etch. The portions of the first ARC layer 90 underlying openings in the first photoresist layer 97 is etched through, and the first lithographic pattern is subsequently transferred through the first OPL 80 during a second step of the first etch. Top surfaces of the second metallic hard mask layer 70 are physically exposed at the bottom of each vias that is formed within the first OPL during the second step of the first etch.

The first step and the second step of the first etch can be performed, for example, by an anisotropic etch such as a reactive ion etch. At least one fluorocarbon gases and/or at least one hydrofluorocarbon gas and/or oxygen and/or nitrogen can be employed to effect the transfer of the first lithographic pattern from the first photoresist layer 97 into the first OPL 80. The first step and the second step of the first etch may employ the same chemistry or different chemistries, and may employ the same or different pressure and/or temperature. In one embodiment, the first ARC layer 90 can functions as an etch mask during the transfer of the first lithographic pattern into the first OPL 80.

Figure 4A:
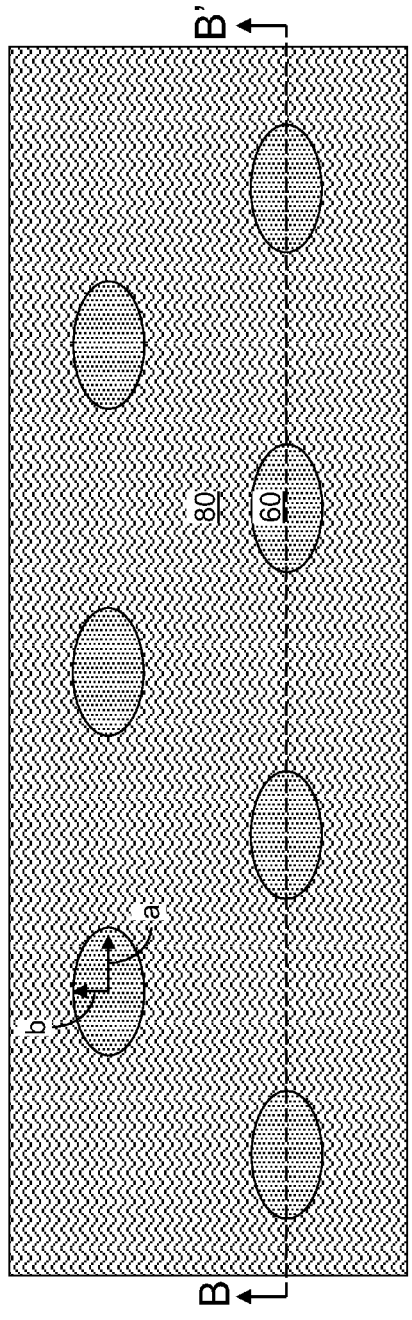
FIG. 4A is a top-down view of the first exemplary structure after transfer of the first lithographic pattern into the second metallic hard mask layer according to the first embodiment of the present disclosure.
Figure 4B:
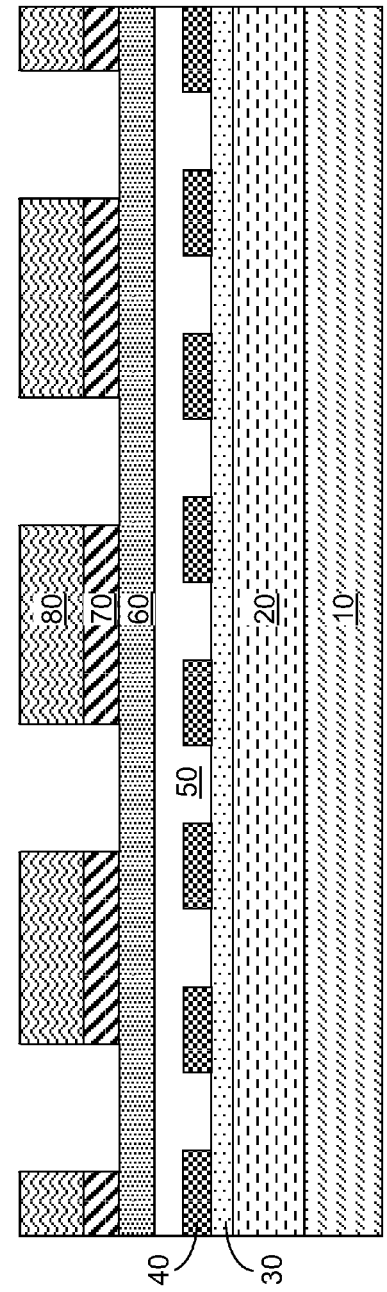
FIG. 4B is a vertical cross-sectional view along the plane B-B' of the first exemplary structure of FIG. 4B.

Referring to FIGS. 4A and 4B, the first lithographic pattern in the first OPL 80 and the first ARC layer 90 is transferred into the second metallic hard mask layer 70 during a third step of the first etch. The third step of the first etch contains halogen gases and/or noble gases. In one embodiment, the third step of this first etch contains $Cl_2$ and Ar. Top surfaces of the at least one dielectric material layer (50, 60) are physically exposed but not etched through at the bottom of each vias in the first OPL 80 at the end of the third step of the first etch. Specifically, the top dielectric layer in the at least one dielectric layer (50, 60) will be an etch stop layer. In one embodiment, the first ARC layer 90 can be consumed during the third step of the first etch.

Figure 5A:
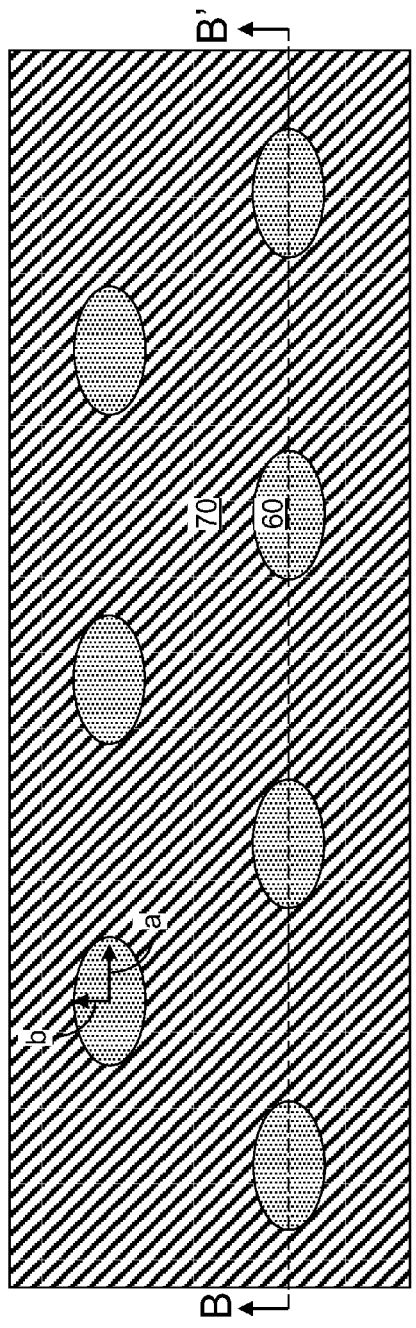
FIG. 5A is a top-down view of the first exemplary structure after removal of the first OPL according to the first embodiment of the present disclosure.
Figure 5B:
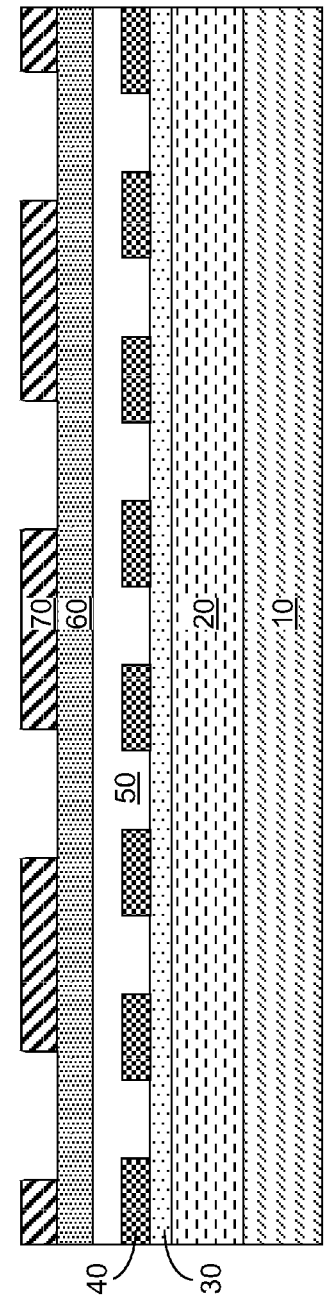
FIG. 5B is a vertical cross-sectional view along the plane B-B' of the first exemplary structure of FIG. 5A.

Referring to FIGS. 5A and 5B, any remaining portion of the first OPL 80 is removed from above the second metallic hard mask layer 70, for example, by ashing. The removal of the first OPL 80 is selective to the materials of the second metallic hard mask layer 70 and to the top portion of the at least one dielectric material layer (50, 60).

Referring to FIGS. 6A and 6B, a second OPL 180, a second ARC layer 190, and a second photoresist layer 197 are sequentially formed over the patterned second metallic hard mask layer 70. The second OPL 180 is formed over the second metallic hard mask layer 70, for example, by spin coating. The second OPL 180 includes a self-planarizing organic planarization material, which can be a polymer layer with low viscosity. The self-planarizing organic planarization material can be any material employed for an organic planarization layer in trilayer lithography methods known in the art. The material of the second OPL 180 can be the same as, or different from, the material of the first OPL 80. The thickness of the second OPL 180, as measured from above the top surface of the patterned second metallic hard mask layer 70, can be from 50 nm to 200 nm, although lesser and greater thicknesses can also be employed.

The second ARC layer 190 is an optional layer, and can be formed, for example, by spin coating. The second ARC layer 190 can include any anti-reflective material known in the art, and can include silicon and/or an organic material. The thickness of the second ARC layer 190 can be from 10 nm to 100 nm, although lesser and greater thicknesses can also be employed.

The second photoresist layer 197 is applied directly on the second ARC layer 190 or directly on the second OPL 180, for example, by spin coating. The thickness of the second photoresist layer 197 can be from 50 nm to 600 nm, although lesser and greater thicknesses can also be employed. The second photoresist layer 197 can be a layer of a photoresist sensitive to deep-ultraviolet (DUV) radiation, extreme ultraviolet (EUV), or mid-ultraviolet (MUV) radiation as known in the art, or can be an e-beam resist that is sensitive to radiation of energetic electrons.

The second photoresist layer 197 is patterned with a second lithographic pattern by lithographic exposure and development. The second lithographic pattern can be a via pattern including shapes for a plurality of second via holes. The shapes for the plurality of second via holes can include circles and/or ellipses. In one embodiment, the plurality of second via holes can include via holes that have minimum printable sizes for any given shape. In one embodiment, the plurality of second via holes can include one or more of an ellipse having a semiminor axis b in a direction parallel to the lengthwise direction of the lines in the at least one line pattern in the first metallic hard mask layer 40 and having a semimajor axis in the direction perpendicular to the lengthwise direction of the lines in the at least one line pattern in the first metallic hard mask layer 40. Selection of the semiminor axis b in the direction parallel to the lengthwise direction of the lines in the at least one line pattern in the first metallic hard mask layer 40 enables subsequent formation of a via hole having a width in the perpendicular to the metal line direction that is less than the minimum printable diameter for a circle in a lithographic pattern. In particular, the vias will be only transferred into the dielectric layer 20 within the metal trenches. In another words, this is called self aligned vias to the metal trenches.

Referring to FIGS. 7A and 7B, the second lithographic pattern in the second photoresist layer 197 is transferred into underlying layers through a set of at least one etch process, which is herein collectively referred to a "second etch." Specifically, the second lithographic pattern in the second photoresist layer 197 is transferred into the second ARC layer 190 employing the second photoresist layer 197 as an etch mask during a first step of the second etch. The portions of the second ARC layer 190 underlying openings in the second photoresist layer 197 is etched through, and the second lithographic pattern is subsequently transferred through the second OPL 180 during a second step of the second etch. Top surfaces of the second metallic hard mask layer 70 are physically exposed at the bottom of each trench that is formed within the second OPL 180 during the second step of the second etch.

The first step and the second step of the second etch can be effected, for example, by an anisotropic etch such as a reactive ion etch. At least one fluorocarbon gases and/or at least one hydrofluorocarbon gas and/or oxygen and/or nitrogen can be employed to effect the transfer of the second lithographic pattern from the second photoresist layer 197 into the second OPL 180. The first step and the second step of the second etch may employ the same chemistry or different chemistries, and may employ the same or different pressure and/or temperature. In one embodiment, the second ARC layer 190 can function as an etch mask during the transfer of the second lithographic pattern into the second OPL 180.

The first exemplary structure at the end of the second step of the second etch, as illustrated in FIGS. 7A and 7B, is a lithographic structure that includes a dielectric material layer, i.e., the interconnect-level dielectric material layer 20, located on the substrate 10; the first metallic hard mask layer 40 including the at least one line pattern and located over the interconnect-level dielectric material layer 20; at least another dielectric material layer, i.e., the stack of the lower planarization layer 50 and the upper dielectric layer 60, located on the first metallic hard mask layer 40; and the second metallic hard mask layer 70 located on the at least another dielectric material layer and including at least a set of at least one hole corresponding to the first lithographic pattern; and an organic planarization layer, i.e., the second OPL 180, located on the second metallic hard mask layer 70 and including at least one via corresponding to the second lithographic pattern that is different from the first lithographic pattern. The lithographic structure further includes an antireflective coating (ARC) layer, i.e., the second ARC layer 190, that is located over the second OPL 180 and including the second lithographic pattern.

Figure 8A:
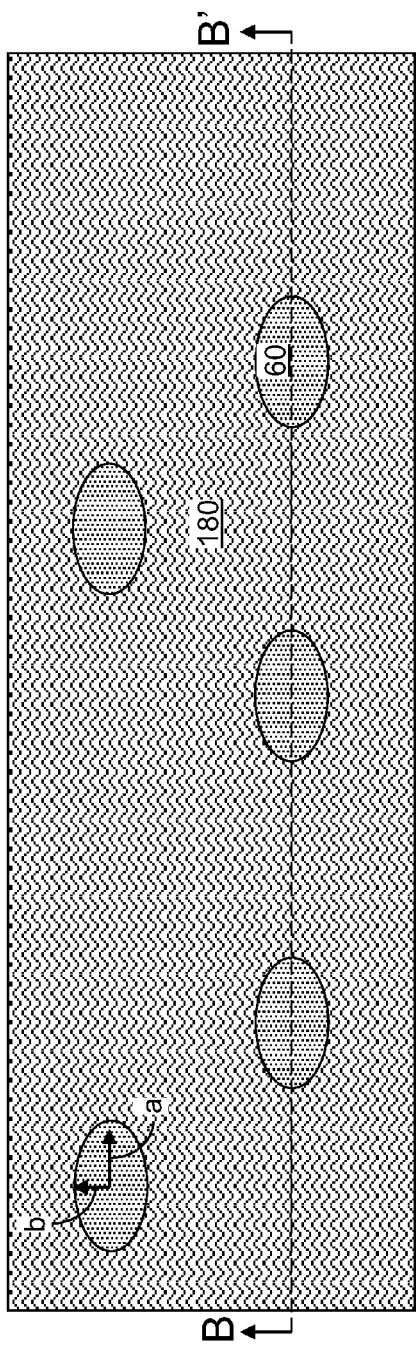
FIG. 8A is a top-down view of the first exemplary structure after transfer of the second lithographic pattern into the second metallic hard mask layer according to the first embodiment of the present disclosure.
Figure 8B:
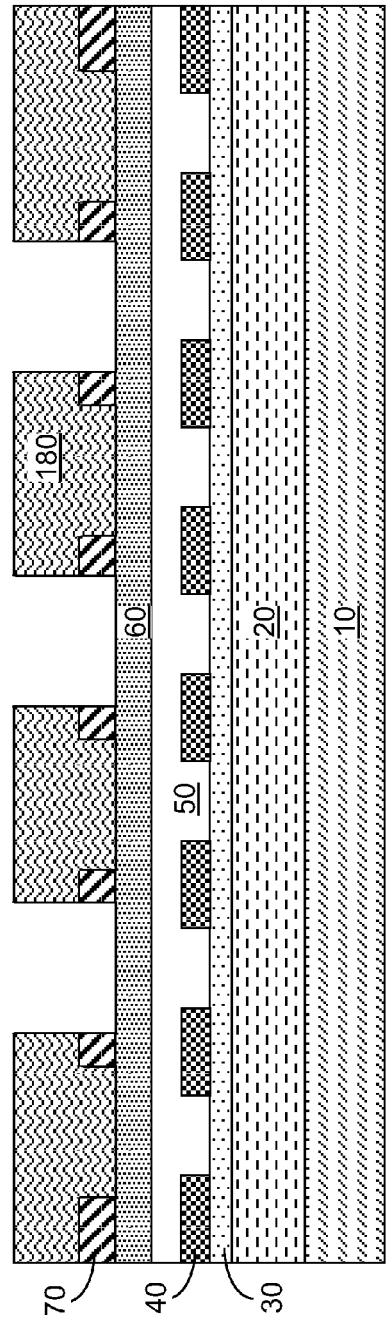
FIG. 8B is a vertical cross-sectional view along the plane B-B' of the first exemplary structure of FIG. 8B.

Referring to FIGS. 8A and 8B, the second lithographic pattern in the second OPL 180 and the second ARC layer 190 is transferred into the second metallic hard mask layer 70 during a third step of the second etch. The third step of the second etch contains halogen gases and/or noble gases. In one embodiment, the third step of this second etch contains $Cl_2$ and Ar. Top surfaces of the at least one dielectric material layer (50, 60) are physically exposed, but not etched through at the bottom of each via in the second OPL 180 at the end of the third step of the second etch. Specifically, the top dielectric layer in the at least one dielectric layer (50, 60) acts as an etch stop layer. In one embodiment, the second ARC layer 190 can be consumed during the third step of the second etch.

A first composite pattern including the first lithographic pattern and the second lithographic pattern is formed in the second metallic hard mask layer 70 by a combination of the first etch and the second etch. The first lithographic pattern and the second lithographic pattern are transferred into the second metallic hard mask layer 70 by the same or different etch processes. Specifically, the first lithographic pattern is transferred into the second metallic hard mask layer 70 by the first etch, and the second lithographic pattern is transferred into the second metallic hard mask layer 70 by the second etch. The first composite pattern is the union of the first lithographic pattern and the second lithographic pattern.

The first exemplary structure at the end of the second step of the second etch, as illustrated in FIGS. 8A and 8B, is a lithographic structure that includes a dielectric material layer, i.e., the interconnect-level dielectric material layer 20, located on the substrate 10; the first metallic hard mask layer 40 including the at least one line pattern and located over the interconnect-level dielectric material layer 20; at least another dielectric material layer, i.e., the stack of the lower planarization layer 50 and the upper dielectric layer 60, located on the first metallic hard mask layer 40; and the second metallic hard mask layer 70 located on the at least one dielectric material layer (50, 60) and including a set of at least one hole corresponding to the first lithographic pattern and including a set of at least another hole corresponding to the second lithographic pattern; and an organic planarization layer, i.e., the second OPL 180, located on the second metallic hard mask layer 70 and including at least one via corresponding to the second lithographic pattern that is different from the first lithographic pattern. The set of at least one hole in the second metallic hard mask layer 70 corresponding to the first lithographic pattern is filled with the second OPL 180, and the set of at least another hole in the second metallic hard mask layer 70 corresponding to the second lithographic pattern is not filled with the second OPL 180.

Figure 9A:
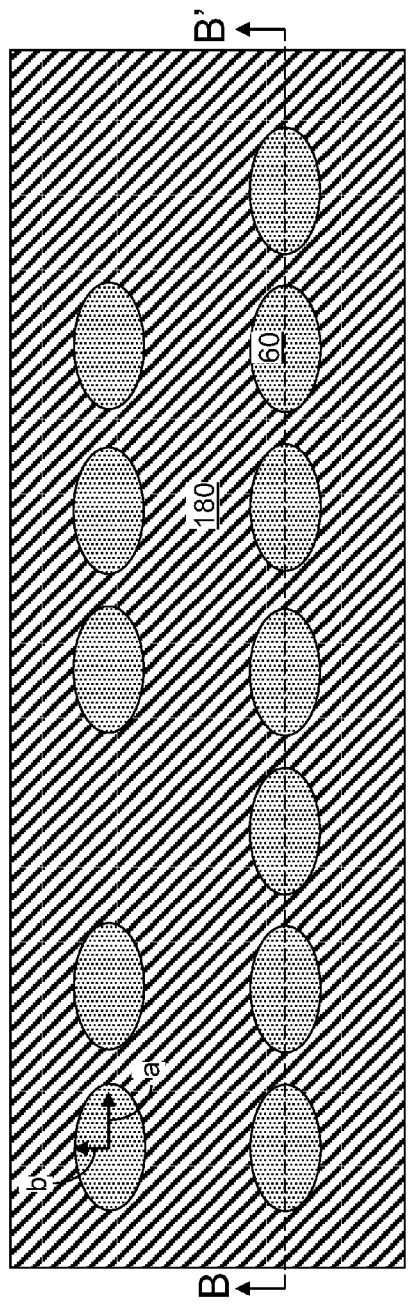
FIG. 9A is a top-down view of the first exemplary structure after removal of the second OPL according to the first embodiment of the present disclosure.
Figure 9B:
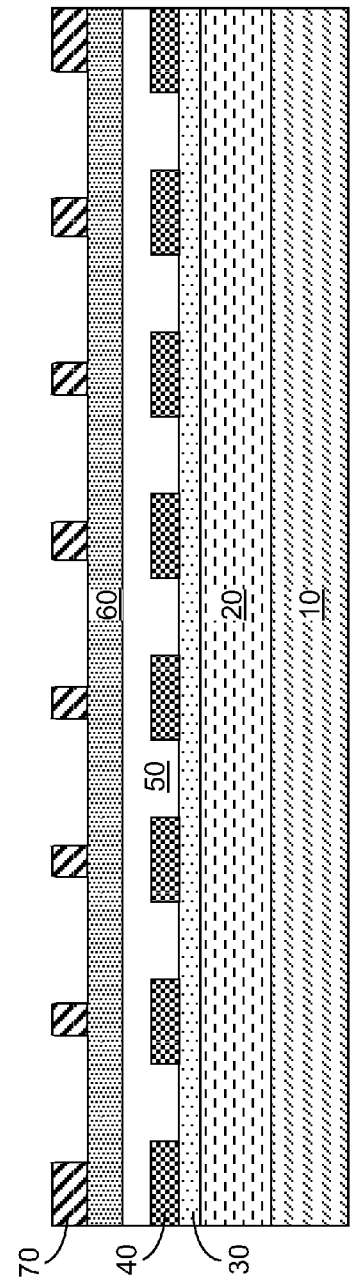
FIG. 9B is a vertical cross-sectional view along the plane B-B' of the first exemplary structure of FIG. 9A.
Figure 11A:
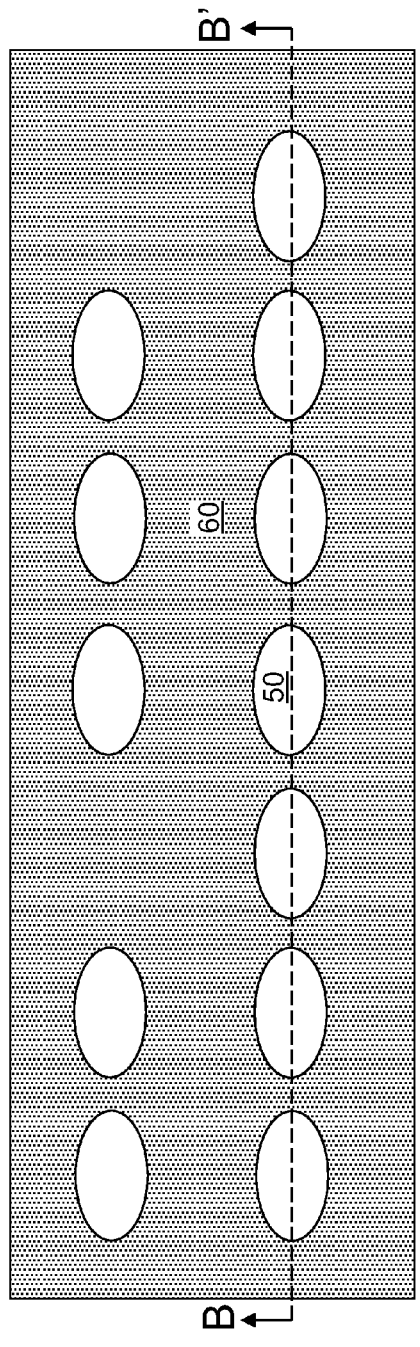
FIG. 11A is a top-down view of the first exemplary structure after removal of the second metallic hard mask layer according to the first embodiment of the present disclosure.
Figure 11B:
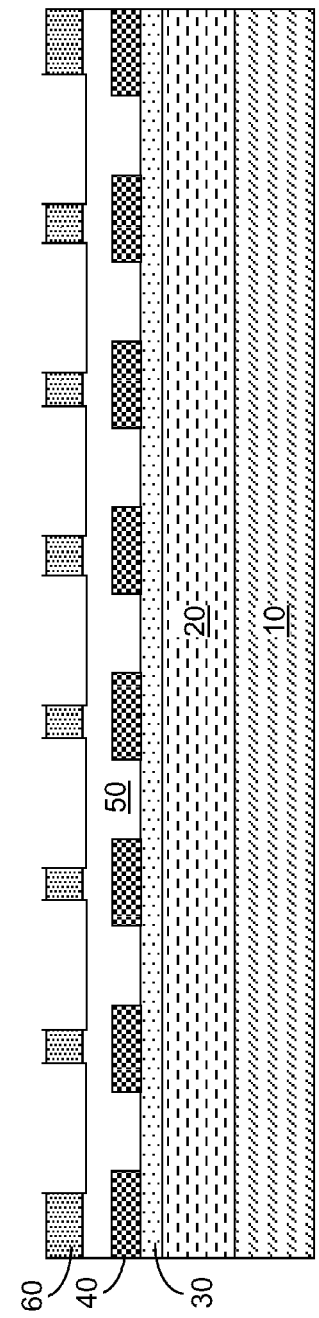
FIG. 11B is a vertical cross-sectional view along the plane B-B' of the first exemplary structure of FIG. 11A.

Referring to FIGS. 9A and 9B, any remaining portion of the second OPL 180 is removed from above the second metallic hard mask layer 70, for example, by ashing. The removal of the second OPL 180 is selective to the materials of the second metallic hard mask layer 70 and to the top portion of the at least one dielectric material layer (50, 60).

Referring to FIGS. 10A and 10B, the first composite pattern is transferred through the at least one dielectric material layer (50, 60) employing another etch, which is herein referred to as a "third etch." The third etch can be an anisotropic etch such as a reactive ion etch. In one embodiment, the third etch employs the patterned second metallic hard mask layer 70 as an etch mask, and employs the lower planarization layer 50 as a stopping layer. By the end of this third etch, the lower planarization layer 50 is not etched through.

Referring to 11A and 11B, the second metallic hardmask 70 is removed by employing an etch. This etch can be dry plasma etch or wet treatment that are selective against the at least one dielectric layer (50, 60). In one embodiment, this etch can employ a plasma etch chemistry that contains halogen gases and/or noble gases. In one embodiment, this dry plasma etch chemistry contains $Cl_2$ and Ar, or $Cl_2$ and He.

In another embodiment, the at least one dielectric layer (50, 60) main contain only one dielectric layer. In this embodiment, the second metallic hardmask layer 70 is different from the first metallic layer 40. In one example, the second metallic hardmask layer 70 is Ti containing ARC layer, and the first metallic layer 40 employs TiN. The third etch employs the patterned second metallic hard mask layer 70 as an etch mask, and employs the first metallic layer 40 as a stopping layer. In this embodiment, the second metallic hardmask 70 is still removed after the third etch. In one example, the second metallic hardmask 70 is removed by a wet chemistry that is selective against the at first metallic hardmask 40, the single layer dielectric layer between the two metallic hardmask layers, and the dielectric hard mask layer 30 and the interconnect-level dielectric material layer 20.

Figure 12A:
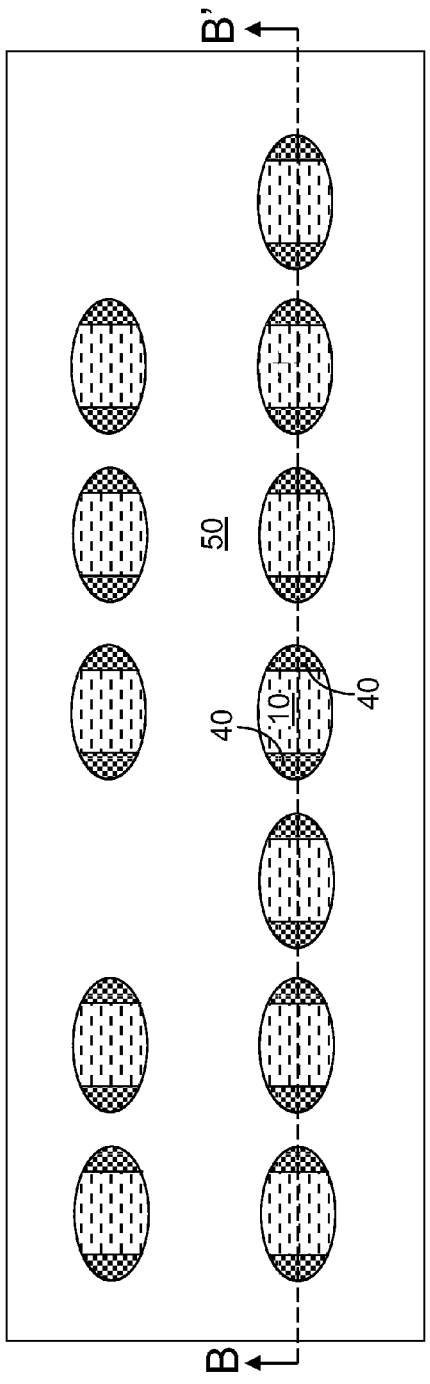
FIG. 12A is a top-down view of the first exemplary structure after transfer of a second composite pattern that is an intersection of the first composite pattern and the pattern in the first metallic hard mask layer into an interconnect-level dielectric material layer according to the first embodiment of the present disclosure.
Figure 12B:
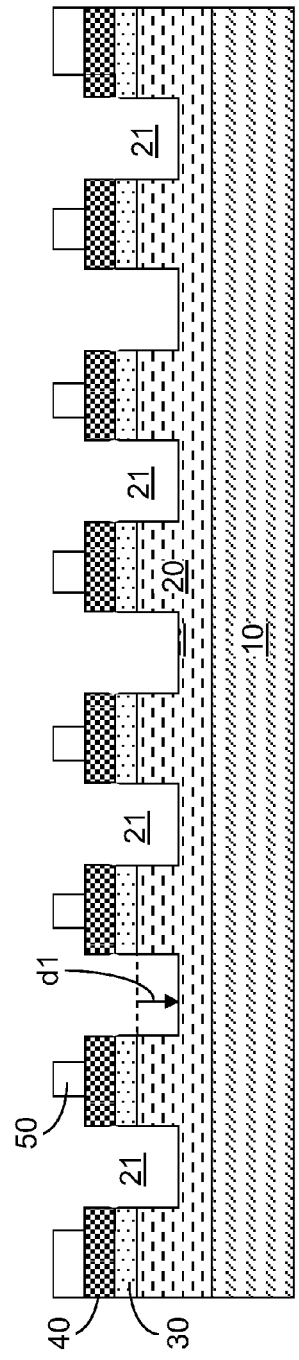
FIG. 12B is a vertical cross-sectional view along the plane B-B' of the first exemplary structure of FIG. 12A.

Referring to FIGS. 12A and 12B, the second composite pattern is transferred into the dielectric hard mask layer 30 and the interconnect-level dielectric material layer 20 employing yet another etch, which is herein referred to as a "fourth etch." The fourth etch can be an anisotropic etch such as a reactive ion etch. The fourth etch employs the combination of the at least one dielectric layer (50, 60) and the first metallic hardmask 40 as the etch mask. Thus, the etch chemistry of the fourth etch etches the dielectric materials of the dielectric hard mask layer 30 and the interconnect-level dielectric material layer 20, and is selective to the first metallic hardmask 40.

Physically exposed portions of the dielectric hard mask layer 30 are etched through, and physically exposed surfaces of the interconnect-level dielectric material layer 20 are vertically recessed to form vias 21 having a first depth d1 from the top surface of the interconnect-level dielectric material layer 20. Thus, the second composite pattern can be transferred to the first depth d1 within the interconnect-level dielectric material layer 20. The first depth d1 can be less than or equal to the thickness t of the interconnect-level dielectric material layer 20.

Figure 13A:
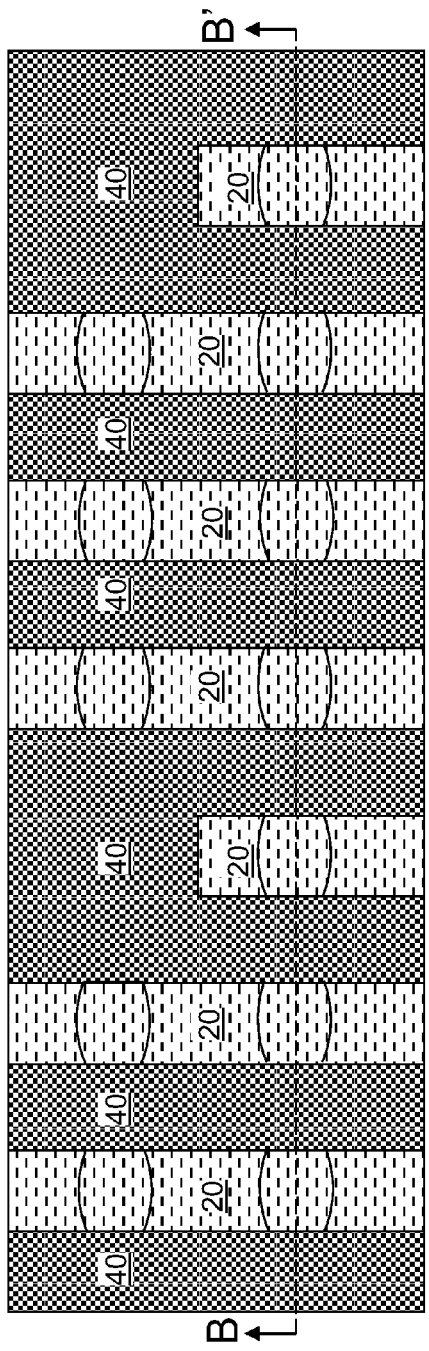
FIG. 13A is a top-down view of the first exemplary structure after removal of the second metallic hard mask layer, the upper dielectric layer, and the lower planarization layer according to the first embodiment of the present disclosure.
Figure 13B:
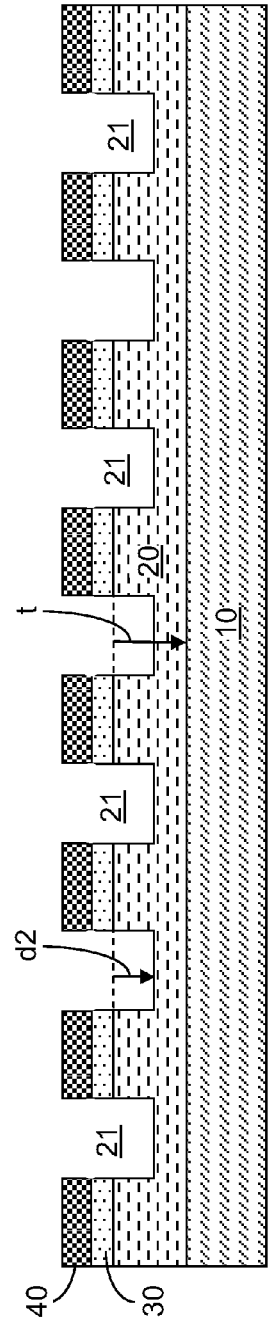
FIG. 13B is a vertical cross-sectional view along the plane B-B' of the first exemplary structure of FIG. 13A.

Referring to FIGS. 13A and 13B, the at least one dielectric layer (50, 60) are removed from above the first metallic hard mask layer 40. In one embodiment, when the at least one dielectric layer (50, 60) contains a lower organic planarization layer 50 and an upper dielectric layer 60, the dielectric layer 60 is removed sacrificially during the dielectric hard mask layer 30 and the interconnect-level dielectric material layer 20 etch. The lower planarization layer 50 can be washed away by employing oxygen containing plasma. In another embodiment, when the at least one dielectric layer (50, 60) contains only a single layer of dielectric layer, this single layer of dielectric layer can be removed by a wet treatment, such as a dilute HF etch.

Figure 14A:
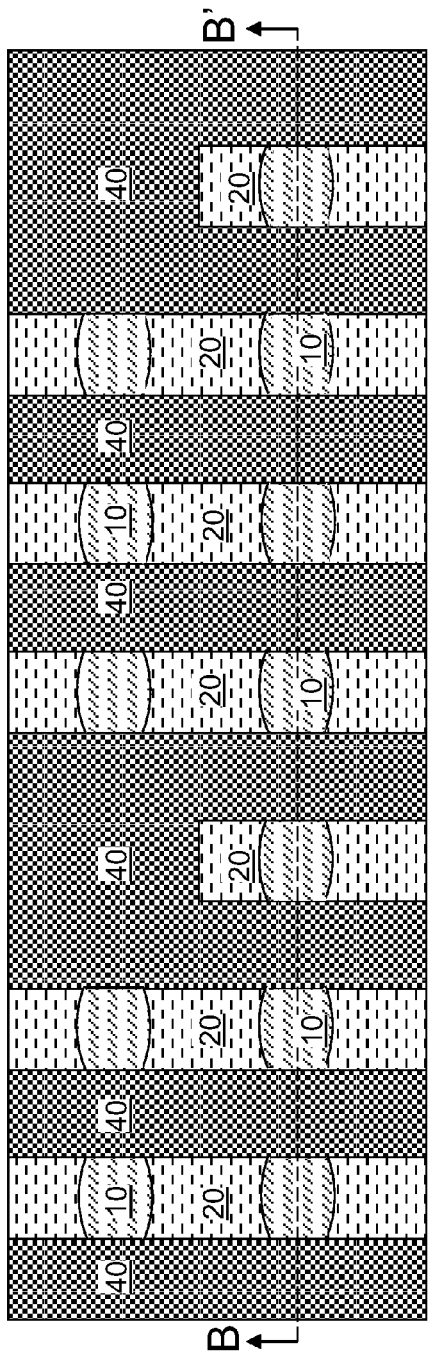
FIG. 14A is a top-down view of the first exemplary structure after transfer of the pattern in the first metallic hard mask layer into an upper portion of the interconnect-level dielectric material layer according to the first embodiment of the present disclosure.
Figure 14B:
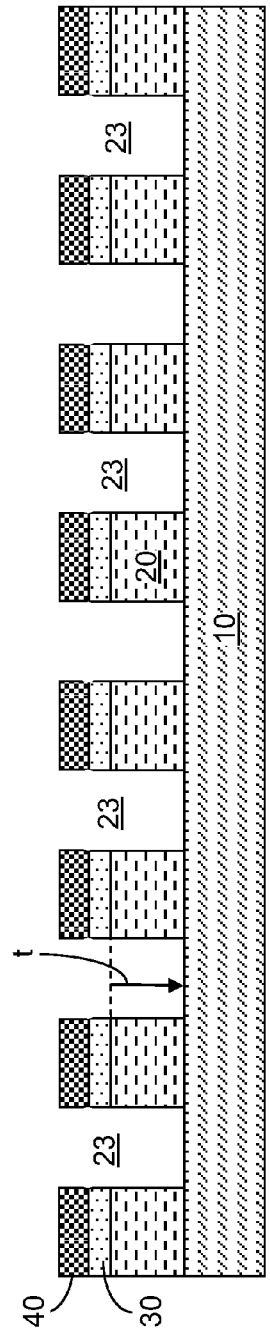
FIG. 14B is a vertical cross-sectional view along the plane B-B' of the first exemplary structure of FIG. 14A.

Referring to FIGS. 14A and 14B, the at least one line pattern in the first metallic hard mask layer 40 is transferred into an upper portion of the interconnect-level dielectric material layer 20 employing another etch, which is herein referred to as a "fifth etch", where the first metallic hardmask layer 40 acts as an etch masking layer. The fifth etch can be an anisotropic etch such as a reactive ion etch. The transfer of the at least one line pattern in the first metallic hard mask layer 40 into the upper portion of the interconnect-level dielectric material layer 20 forms at least one line trench. The second composite pattern, which is present within the interconnect-level dielectric material layer 20 at the vias 21, is further transferred to another depth that is greater than the second depth d1, and etched through the interconnect-level dielectric material layer 20 during transfer of the at least one line pattern into the interconnect-level dielectric material layer 20. At least one dual-damascene trench 23, in which at least one via cavity is integrally formed with at least one line cavity, is formed within the interconnect-level dielectric material layer 20. Each of the via cavities can extend to the bottom surface of the interconnect-level dielectric material layer 20, and landed on the metal line underneath.

Figure 15A:
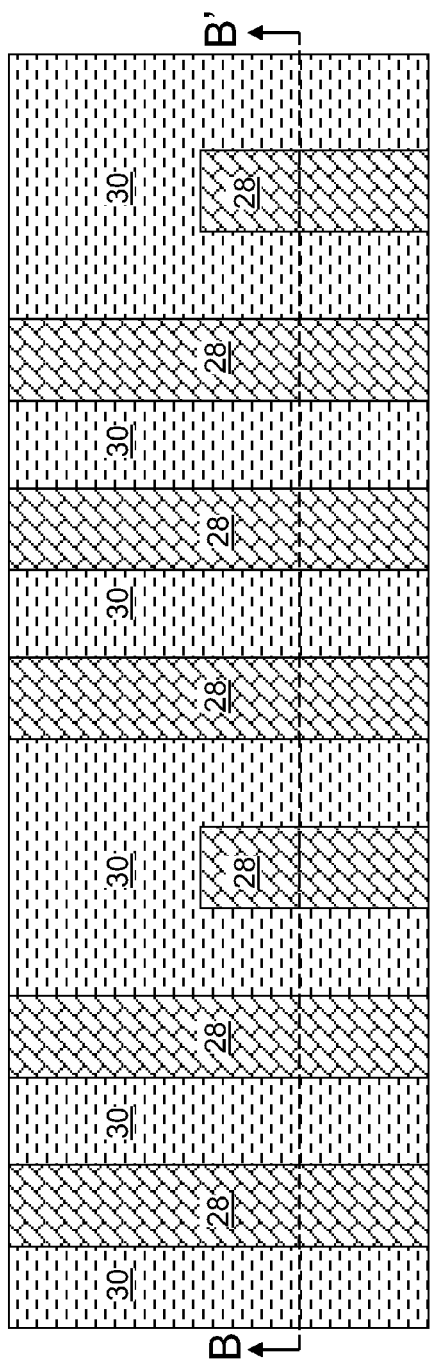
FIG. 15A is a top-down view of the first exemplary structure after formation of dual-damascene line-via structures within the interconnect-level dielectric material layer according to the first embodiment of the present disclosure.
Figure 15B:
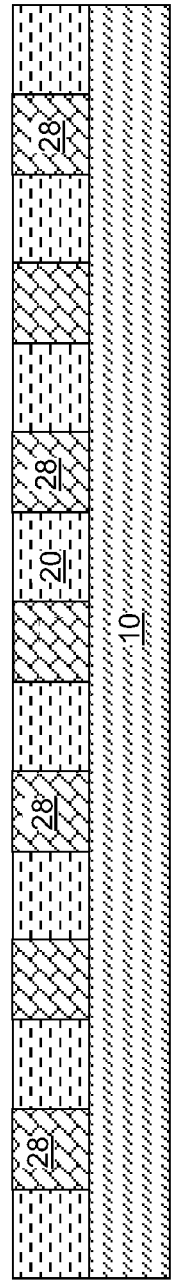
FIG. 15B is a vertical cross-sectional view along the plane B-B' of the first exemplary structure of FIG. 15B.

Referring to FIGS. 15A and 15B, at least one integrated line-via structure 28, in which at least one conductive via structure is integrally formed with at least one conductive line structure, is formed within the stack of the interconnect-level dielectric material layer 20 and the optional dielectric hard mask layer 30. For example, a conductive material can be deposited within the at least one dual-damascene trench 23, and subsequently planarized employing a chemical mechanical polishing (CMP) that removes the first metal hardmask layer 40, the dielectric hard mask layer 30 and an upper portion of the interconnect-level dielectric material layer 20.

The methods of the present disclosure prevents lateral expansion of the second lithographic pattern during the transfer of the first lithographic pattern into the second metallic hard mask layer 70 during the second etch because the second OPL 180 covers the holes within the second metallic hard mask layer 70 that correspond to the first lithographic pattern, and this introduces OPL etch thickness difference between the two set of patterns from two litho exposures.

Figure 16A:
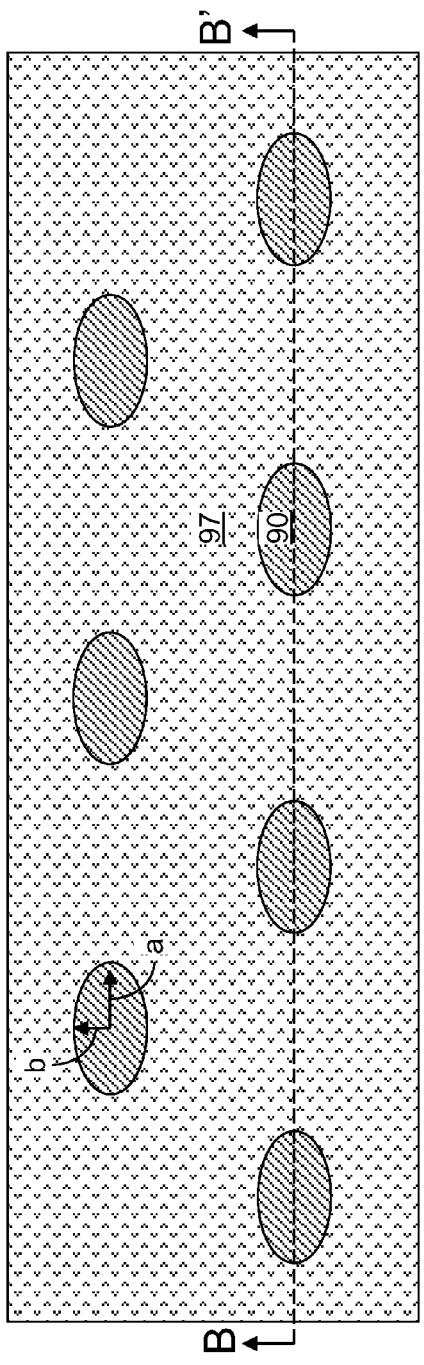
FIG. 16A is a top-down view of a second exemplary structure according to a second embodiment of the present disclosure.
Figure 16B:
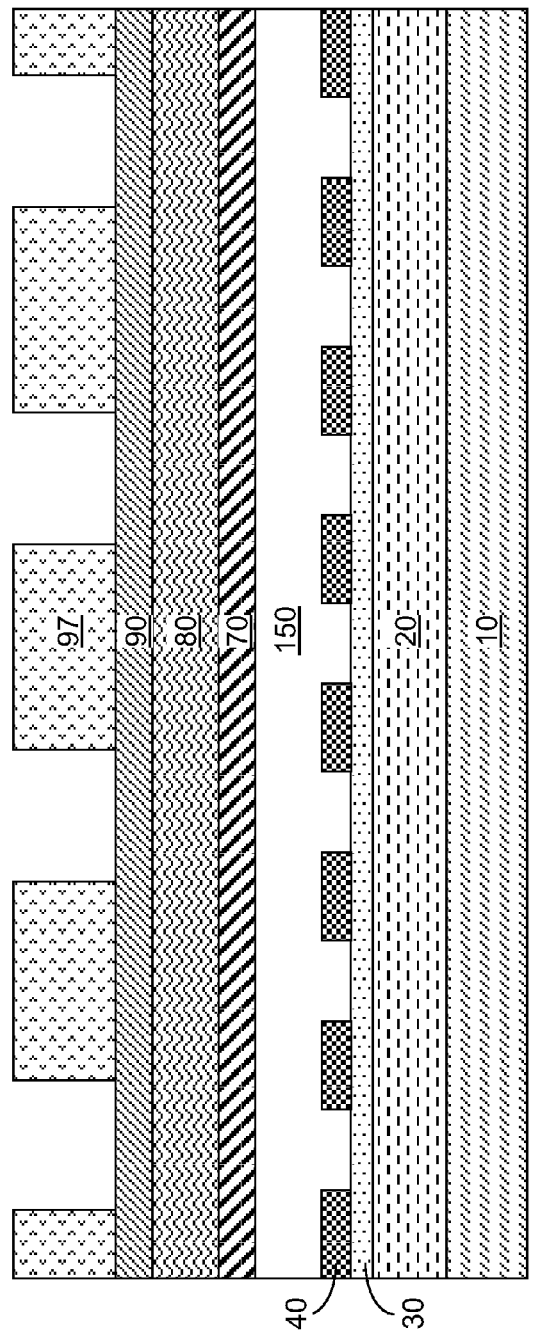
FIG. 16B is a vertical cross-sectional view along the plane B-B' of the second exemplary structure of FIG. 16A.

A second exemplary structure according to a second embodiment of the present disclosure can be derived from the first exemplary structure by substituting a single dielectric material layer, which is herein referred to as an inter-metallic-hard-mask dielectric material layer 150, for the at least one dielectric material layer (50, 60) of the first embodiment. FIGS. 16A and 16B illustrate the second exemplary structure at a processing step corresponding to FIGS. 6A and 6B of the first embodiment. In the second embodiment, the same processing steps can be employed as in the first embodiment except for the substitution of the inter-metallic-hard-mask dielectric material layer 150 for the at least one dielectric material layer (50, 60) of the first embodiment.

In one embodiment, the inter-metallic-hard-mask dielectric material layer 150 can include a hydrogenated silicon nitride material having a composition of $Si_3H_xN_y$, in which x is greater than 0 and is less than 2, and y is greater than 2 and is less than 5.

While the disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the disclosure is intended to encompass all such alternatives, modifications and variations which fall within the scope and spirit of the disclosure and the following claims.

What is claimed is:

1. A lithographic structure comprising:
    a dielectric material layer located on a substrate;
    a first metallic hard mask layer including at least one line pattern and located over said dielectric material layer;
    at least another dielectric material layer located on said first metallic hard mask layer;
    a second metallic hard mask layer located on said at least another dielectric material layer and including at least a set of at least one hole corresponding to a first lithographic pattern and a set of at least another hole corresponding to a second lithographic pattern different from said first lithographic pattern; and
    an organic planarization layer located on said second metallic hard mask layer and including at least one trench corresponding to said second lithographic pattern, wherein said organic planarization layer completely fills each hole in said set of at least one hole, and each of said at least one trench exposes entire sidewalls, but not any of top surfaces, of said second metallic hard mask layer.

2. The lithographic structure of claim 1, further comprising an anti-reflective coating (ARC) layer located over said organic planarization layer and including said second lithographic pattern.

3. The lithographic structure of claim 1, wherein said set of at least one hole corresponding to said first lithographic pattern is filled with said organic planarization layer, and said set of at least another hole corresponding to said second lithographic pattern is not filled with said organic planarization layer.

4. The lithographic structure of claim 1, wherein said first metallic hard mask layer consists of at least one metallic material.

5. The lithographic structure of claim 4, wherein said first metallic hard mask layer includes at least one of TiN, TaN, WN, Ti, Ta, and W.

6. The lithographic structure of claim 1, wherein said first metallic hard mask layer includes at least one metallic material and an organic material.

7. The lithographic structure of claim 6, wherein said one metallic material includes at least one of Ta, Ti, W, TaN, TiN, and WN.

8. The lithographic structure of claim 6, wherein said at least one metallic material is interspersed within a matrix of said organic material.

9. The lithographic structure of claim 1, wherein said second metallic hard mask layer includes at least one metallic material.

10. The lithographic structure of claim 9 wherein said at one metallic material includes at least one of TiN, TaN, WN, Ti, Ta, and W.

11. The lithographic structure of claim 9, wherein said second metallic hard mask layer further includes an organic material.

12. The lithographic structure of claim 11, wherein said at least one metallic material is interspersed within a matrix of said organic material.

13. The lithographic structure of claim 1, wherein said set of at least one hole extends through an entire thickness of said second metallic hard mask layer.

14. A lithographic structure comprising:
    a dielectric material layer located on a substrate;
    a first metallic hard mask layer including at least one line pattern and located over said dielectric material layer;
    at least another dielectric material layer located on said first metallic hard mask layer;
    a second metallic hard mask layer located on said at least another dielectric material layer and including at least a set of at least one hole corresponding to a first lithographic pattern and a set of at least another hole corresponding to a second lithographic pattern different from said first lithographic pattern;
    an organic planarization layer located on said second metallic hard mask layer and including at least one trench corresponding to said second lithographic pattern; and
    an anti-reflective coating (ARC) located on said organic planarization layer and including said second lithographic pattern,
    wherein said organic planarization layer completely fills each hole in said set of at least one hole and each of said at least one trench exposes entire sidewalls, but not any of top surfaces, of said second metallic hard mask layer.

15. The lithographic structure of claim 14, wherein said set of at least one hole extends through an entire thickness of said second metallic hard mask layer.

16. The lithographic structure of claim 14, wherein each of said first metallic hard mask layer and said second metallic hard mask layer comprises at least one of TiN, TaN, WN, Ti, Ta, and W.

* * * * *